United States Patent [19]
Hsieh et al.

[11] Patent Number: 5,465,056
[45] Date of Patent: Nov. 7, 1995

[54] APPARATUS FOR PROGRAMMABLE CIRCUIT AND SIGNAL SWITCHING

[75] Inventors: Wen-Jai Hsieh; Chi-Song Horng; Chun C. D. Wong, all of Palo Alto, Calif.

[73] Assignee: I-Cube, Inc., Santa Clara, Calif.

[21] Appl. No.: 333,524

[22] Filed: Nov. 2, 1994

Related U.S. Application Data

[63] Continuation-in-part of Ser. No. 269,794, Jun. 30, 1994.
[51] Int. Cl.$^6$ .............................. H03K 19/0175
[52] U.S. Cl. ............... 326/41; 326/38; 340/825.87
[58] Field of Search ............ 340/825.85, 825.87, 340/825.89; 326/37–39, 41, 101

[56] References Cited

U.S. PATENT DOCUMENTS

| | | | |
|---|---|---|---|
| 4,068,215 | 1/1978 | Mukaemachi et al. | 340/825.87 X |
| 4,670,749 | 6/1987 | Freeman | 326/41 X |
| 4,745,409 | 5/1988 | Hofmann | 340/825.87 X |
| 4,817,082 | 3/1989 | Orsic | 340/825.85 X |
| 4,973,956 | 11/1990 | Lin et al. | 340/825.89 X |
| 5,282,271 | 1/1994 | Hsieh et al. | 340/825.85 X |

Primary Examiner—David R. Hudspeth
Attorney, Agent, or Firm—Smith-Hill and Bedell

[57] ABSTRACT

A field programmable interconnect device (FPID) includes a set of ports and an array of switch cells for selectively interconnecting pairs of the ports. The switch cells are organized into a hierarchy of subarrays, and a control cell is provided for each subarray. Each switch cell includes a crosspoint switch and a single-bit memory. A bit stored in the memory indicates whether the switch, when enabled, is to interconnect its pair of FPID I/O ports. A data bit stored in each control cell indicates whether all switching cells of an associated subarray are enabled. In a "rapid connect" mode of operation, the FPID sets the state of the bit stored in any individual switch or control cell in response to parallel input data identifying the cell and indicating the state of the bit to be stored in the cell. In the rapid connect mode, the FPID can be programmed to rapidly switch connections between individual lines or between parallel buses connected to its ports.

23 Claims, 11 Drawing Sheets

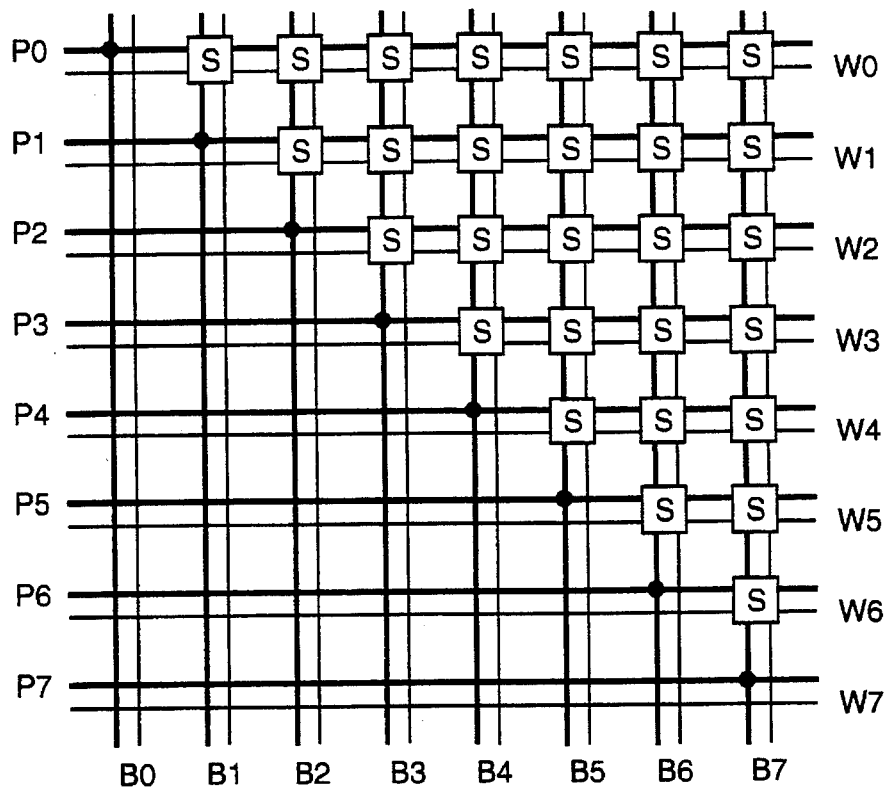
FIG. 3A
(PRIOR ART)
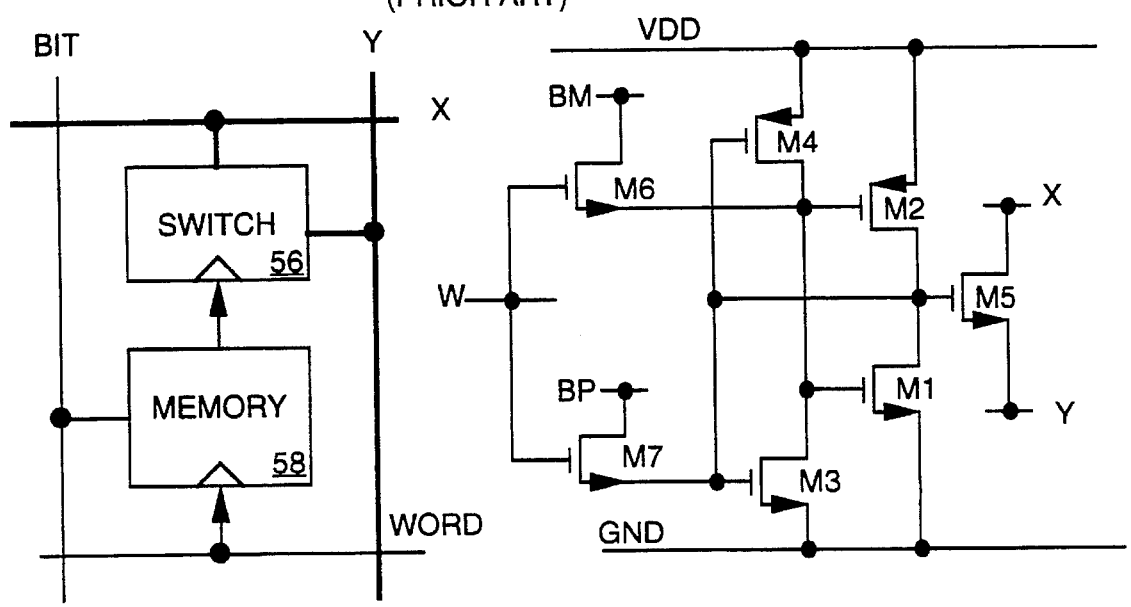
FIG. 3B
(PRIOR ART)
FIG. 3C
(PRIOR ART)

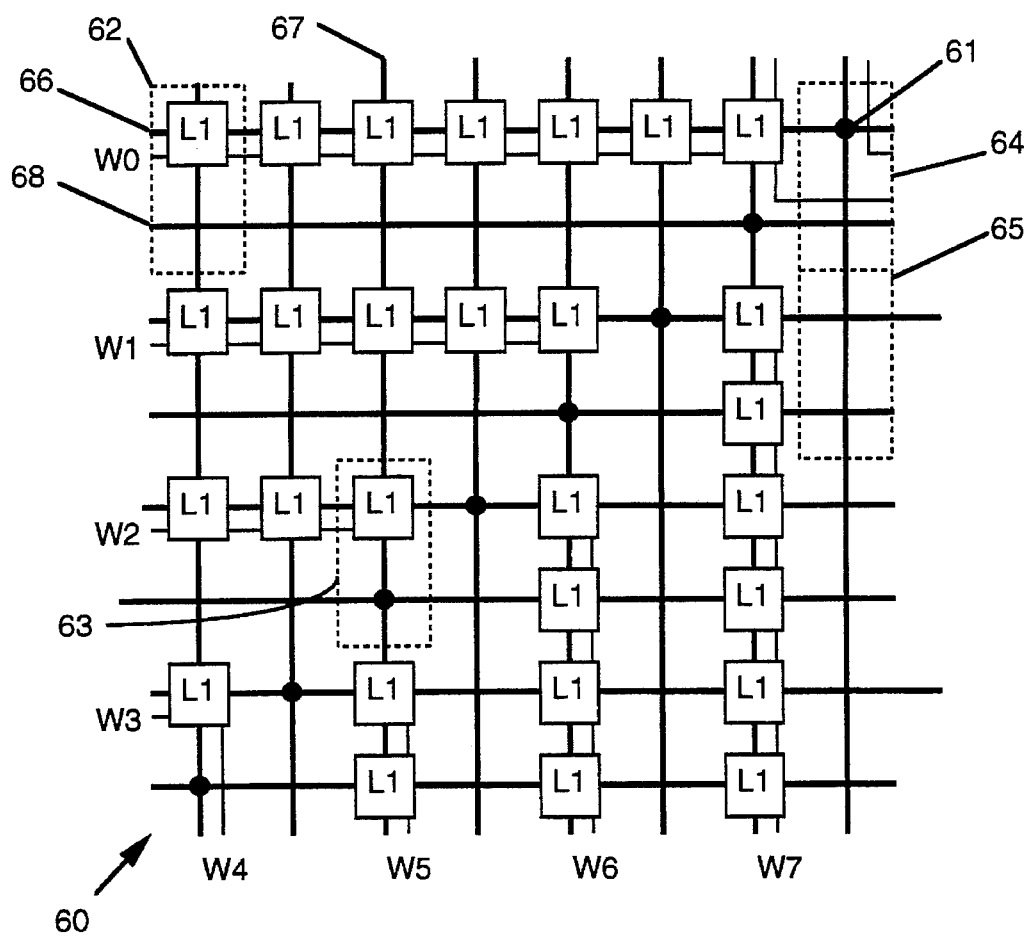
FIG. 4B
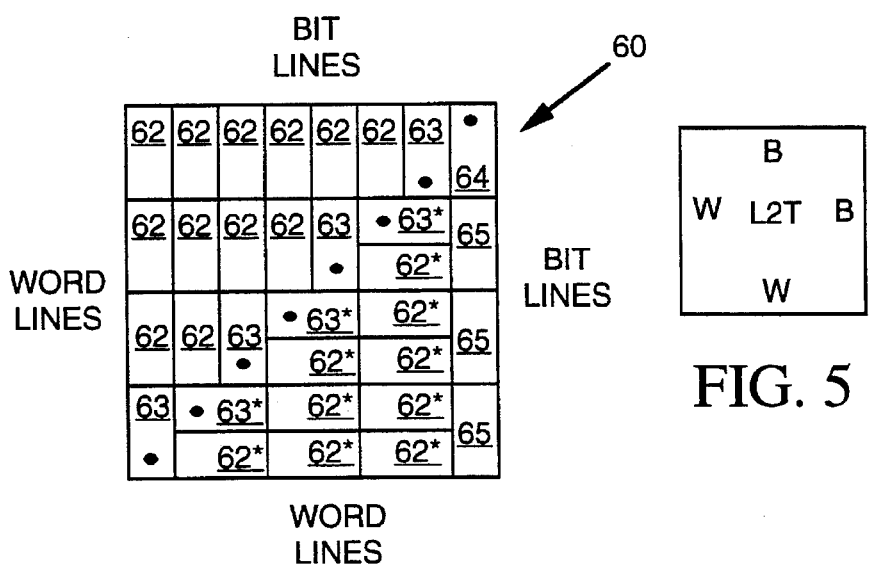
FIG. 4C
FIG. 5

APPARATUS FOR PROGRAMMABLE CIRCUIT AND SIGNAL SWITCHING

CROSS-REFERENCE TO RELATED APPLICATIONS

The present application is a continuation-in-part of copending application Ser. No. 08/269,794, filed Jun. 30, 1994 still pending.

BACKGROUND OF THE INVENTION

1. Field of the Invention

The present invention relates in general to a type of crosspoint array switch known as a field programmable interconnect device (FPID), and in particular to an FPID adapted for rapid signal switching.

2. Description of Related Art

Background Art

Many electronic systems employ field programmable gate arrays (FPGAs), such as those manufactured by Xilinx Inc., to selectively reconfigure system component interconnections for various modes of system operation. A typical FPGA includes several input and output ports and a network of logic gates interconnecting the input and output ports. The logic gates respond to signals at the input ports to produce signals at the output ports. The FPGA also includes a number of memory cells that store data received from an external source such as a computer. The data in the memory cells control switching states of various gates in the FPGA. By loading data into the memory cells, the computer configures (i.e. "programs") the FPGA for generating an output signal at any given port that is a selected logical combination of states of input signals at one or more of the input ports. Thus, an FPGA may be used for selectively routing signals between system components and may also be used to perform various logic operations on the signals.

While programmable FPGAs are useful, they have limitations. All input/output signals must be unidirectional and all signals must be of the same logic circuit type, such as TTL or CMOS. Thus, the FPGAs cannot be connected to bi-directional signal sources and cannot interface differing types of devices such as TTL and CMOS devices. In addition, the attributes of the I/O ports of an FPGA cannot be varied, nor can they be dynamically configured.

On the other hand, a field programmable interconnect device (FPID) flexibly interconnects a set of electronic components such as integrated circuits and other devices to one another. The FPID comprises an integrated circuit chip including a set of ports and a crosspoint switch programmable to connect any one port to any other port. Preferably, FPIDs are "non-blocking", that is any idle I/O port may be connected to any other idle I/O port at any time.

Typically, FPID I/O ports are buffered and may be programmed to operate in various modes including unidirectional and bi-directional, with or without tristate control, and to operate at either TTL or CMOS input or output logic levels with adjustable pull up currents. Further, FPID ports may also be programmed to perform various operations on buffered signals including adjustable delay of the signal, inverting the signal or forcing the signal at the port high or low.

A typical FPID, manufactured by I-Cube, Inc., of Santa Clara, Calif., is an integrated circuit chip including a multiple port crosspoint switch that can be programmed to connect any one port to any other port, and is linked to a host computer via an internal IEEE standard 1149.1 "JTAG" bus. The JTAG bus carries data between the FPID and the host computer and permits the host computer to program the FPID for making the desired connections. The JTAG bus also enables the host computer to select various modes of operation of buffers within the FPID and to read out data stored in the FPID. The JTAG bus also permits serial programming of the FPID on a row-by-row basis, with a protocol defining the status of a row of cells in the array and a corresponding definition of the row address. Such a configuration is taught in U.S. Pat. No. 5,282,271 titled I/O BUFFERING SYSTEM TO A PROGRAMMABLE SWITCHING APPARATUS issued Jan. 25, 1994 to Wen-Jai Hsieh et al.

FPIDs are available in a variety of I/O densities, ranging from 96 to 320 usable ports. Presently, FPID devices are manufactured with a 0.8 micron CMOS static RAM process, and are available in a variety of industry standard packaging options.

A typical FPID includes an array of cells, each cell including a crosspoint switch and a single-bit memory. For example, a 320 port FPID has 320 rows of cells with up to 320 cells per row. The crosspoint switch of each cell selectively interconnects two I/O ports. The data bit stored in the memory of each cell controls the state of the crosspoint switch. Thus by changing the state of the bit stored in the memory of a particular cell, a user can make or break a connection between two particular I/O ports.

The memory cells of the FPID are programmed on a row-by-row basis through data arriving on the serial JTAG bus. A user may wish to change only the single bit stored in the memory of one crosspoint array cell, thereby to make or break a single connection between two specific FPID I/O ports. But to do so, the user must reprogram not just the cell of interest, but all 320 cells of the row containing the cell of interest. In order to program a row of crosspoint switches the user has to serially transmit 320 bits of programming data to the FPID via the JTAG bus, one bit for each cell of the row, along with several control bits and bits indicating a row address. Thus in a prior art FPID, making or breaking a single connection between two FPID I/O ports requires a substantial number of clock cycles on the JTAG bus.

Since so many clock cycles are required to alter the programming of an FPID, FPIDs have typically not been used in applications where high switching speed is important. For example an FPID could be used for switching the parallel I/O bus of a computer processor between buses of selected peripheral devices. But to switch from one bus to another, the contents of a large number of FPID memory cells must be altered. The time required to write data to so many memory cells makes the FPID too slow for many bus switching applications.

What is needed is an improved FPID whose programming can be rapidly altered with minimal input data and which can switch between buses with minimal programming delay.

SUMMARY OF THE INVENTION

An integrated circuit field programmable interconnect device (FPID) includes a plurality of ports and an array of cells arranged into rows and columns. Each cell includes a crosspoint switch and a single-bit memory. The crosspoint switch of each cell interconnects a separate pair of the FPID I/O ports. The bit stored in the memory of each cell controls the state of the cell's crosspoint switch so as to make or break a data path between the two FPID I/O ports it interconnects. In a "normal" mode of operation, the memory cells of the FPID may be programmed on a row-by-row basis through data transmitted to the FPID via a serial bus.

In accordance with one aspect of the invention, the FPID also provides a "rapid connect" mode of operation, wherein the FPID sets the state of the bit stored in any individual cell of the array in response to data arriving at the FPID through a parallel bus. That data indicates the position within the array of a particular cell of interest and the state of the bit to be stored in the cell of interest. The rapid connect mode of operation permits a user to command the FPID to alter an individual crosspoint connection in only a single cycle of the parallel bus.

In accordance with a further aspect of the invention, in the rapid connect mode of operation, the data conveyed on the parallel bus also indicates one of three actions to be taken with regard to other cells in the array row of the cell of interest. These actions include leaving the data bits stored in the other cells unchanged or setting the bits stored in all of the other cells of the array row low so as to concurrently break all connections made by the other cells. The FPID includes circuitry for carrying out the indicated action at the same time that it writes the indicated bit into the cell of interest.

In accordance with another aspect of the invention, the array of cells is organized into a hierarchy of subarrays, with a control cell being provided for each subarray. Each control cell stores a bit, and depending on the bit state, the control cell can either inhibit or enable the switching operation of all of the switching cells of its associated subarray of switching cells. Thus by setting the state of bit in a few control cells, a user can inhibit or enable operation of large blocks of switching cells.

In accordance with yet another aspect of the invention, control cell memories may also be write accessed using both the normal and rapid connect modes of operation. The hierarchical control arrangement of the switching cells, in combination with availability of the rapid connect mode of operation for writing to control cells, allows the FPID to rapidly switch between parallel busses.

It is accordingly an object of the invention to provide a compact FPID which permits a user to rapidly alter individual crosspoint connections.

It is another object of the invention to provide an improved FPID which allows for rapidly switching between buses connected to its ports.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 3A is a block diagram of prior art triangular crosspoint array;

FIG. 3B is a block diagram of a typical switch cell of the crosspoint array of FIG. 3A;

FIG. 3C is a schematic diagram of the switch cell of FIG. 3C;

Figure 4A:
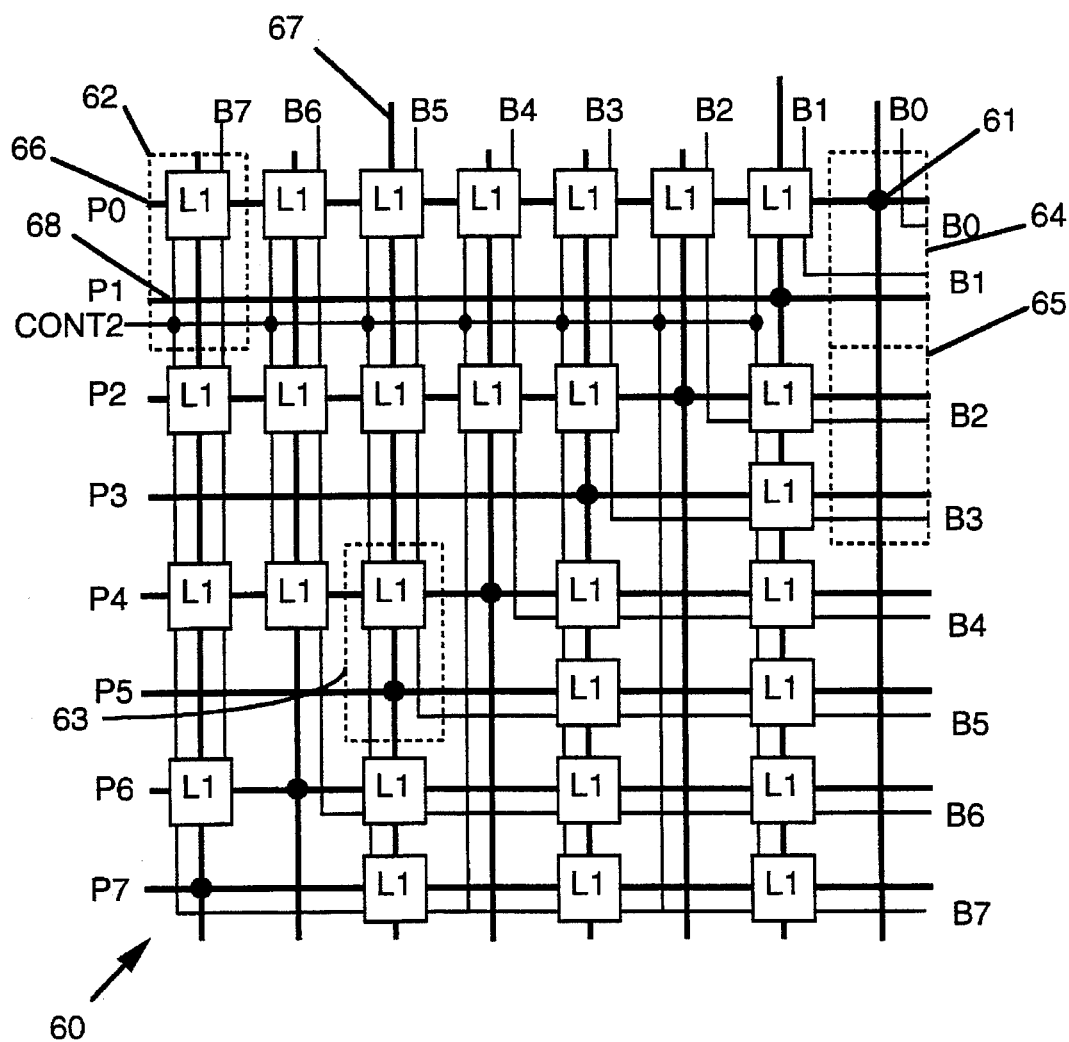
Figure 6:
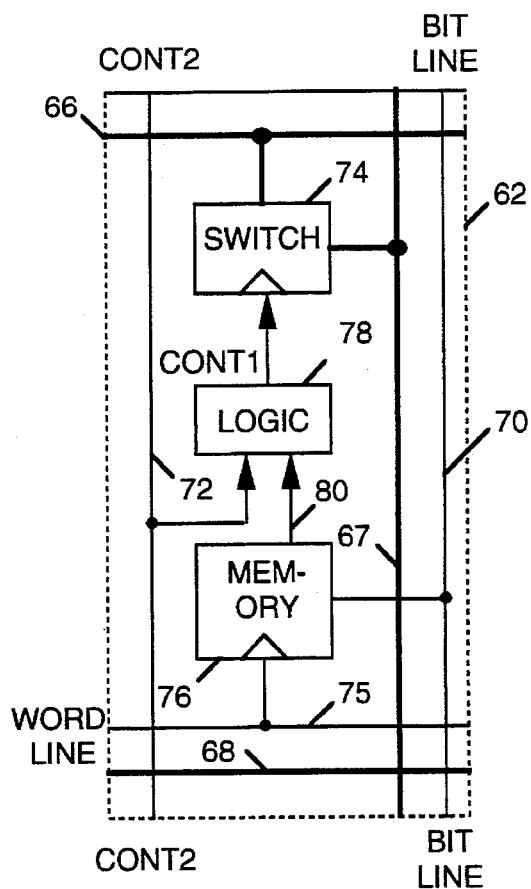
Figure 7:
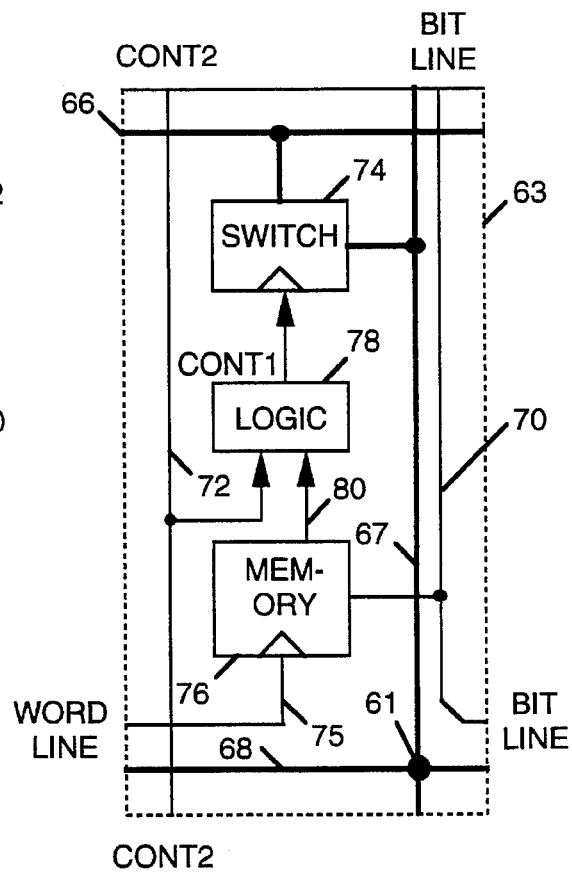
Figure 8:
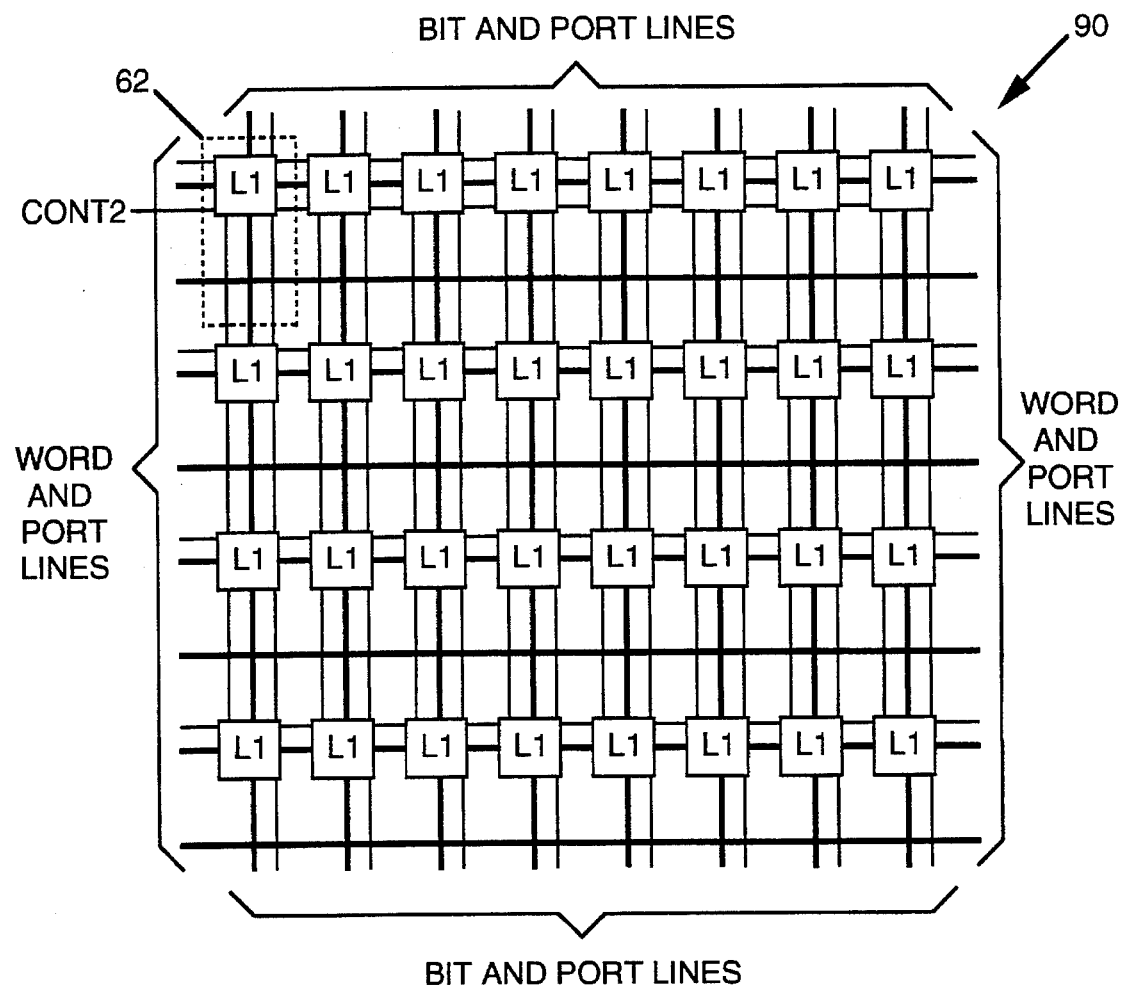
Figure 9:
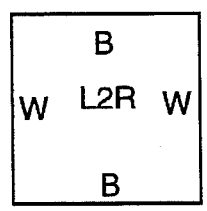
Figure 10:
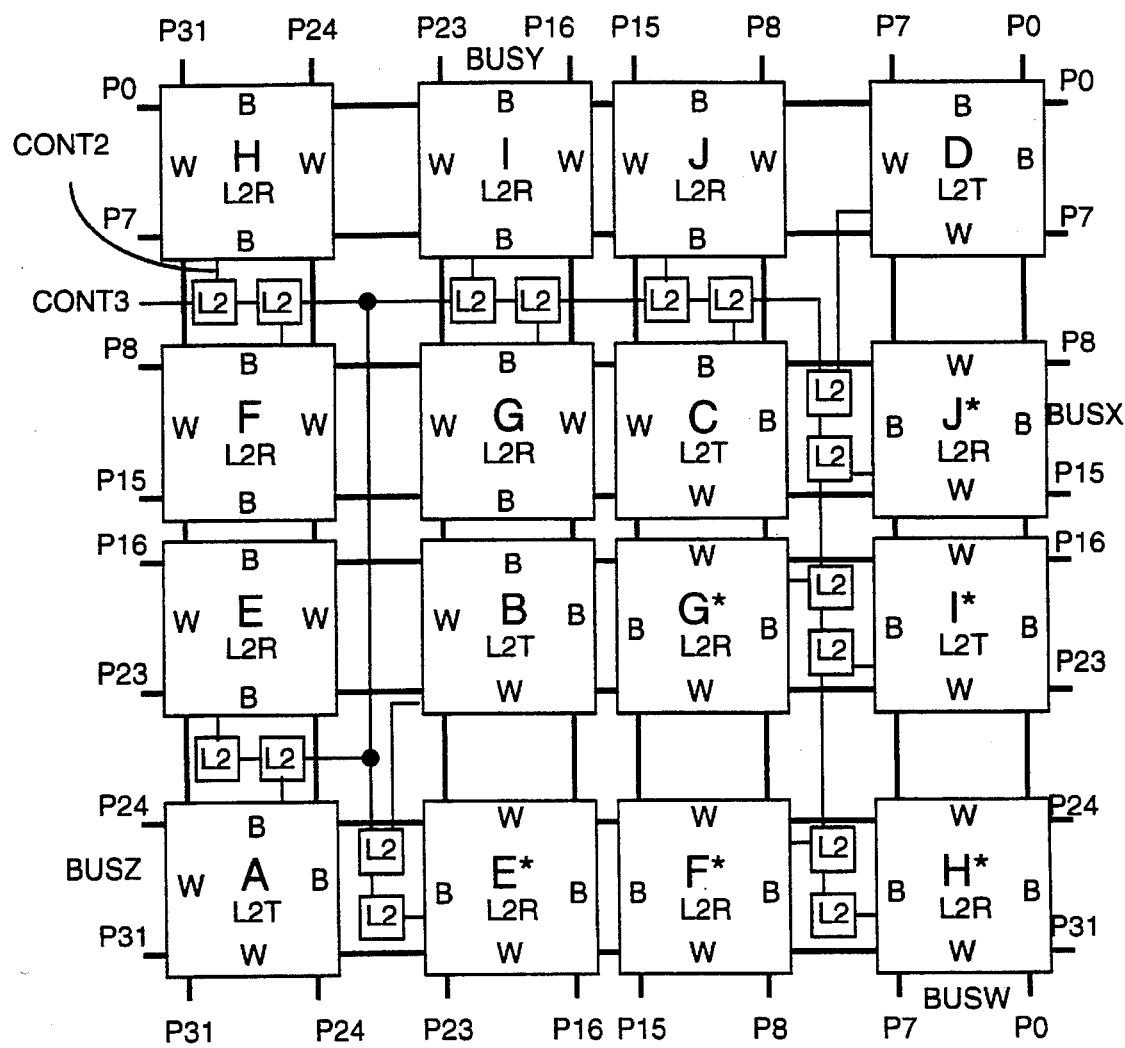
Figures 10A, 10B:
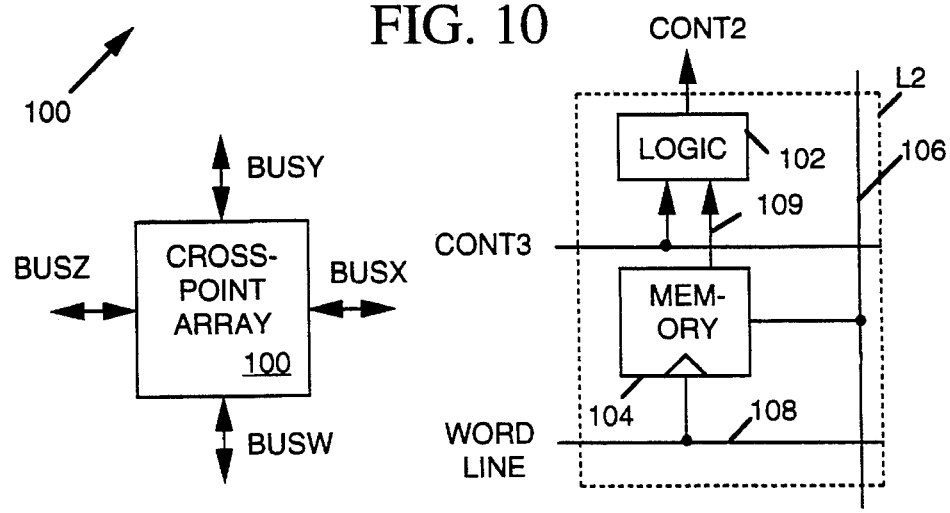
Figure 11:
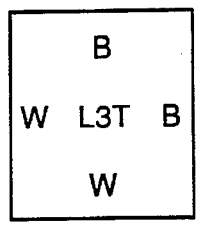
Figure 12:
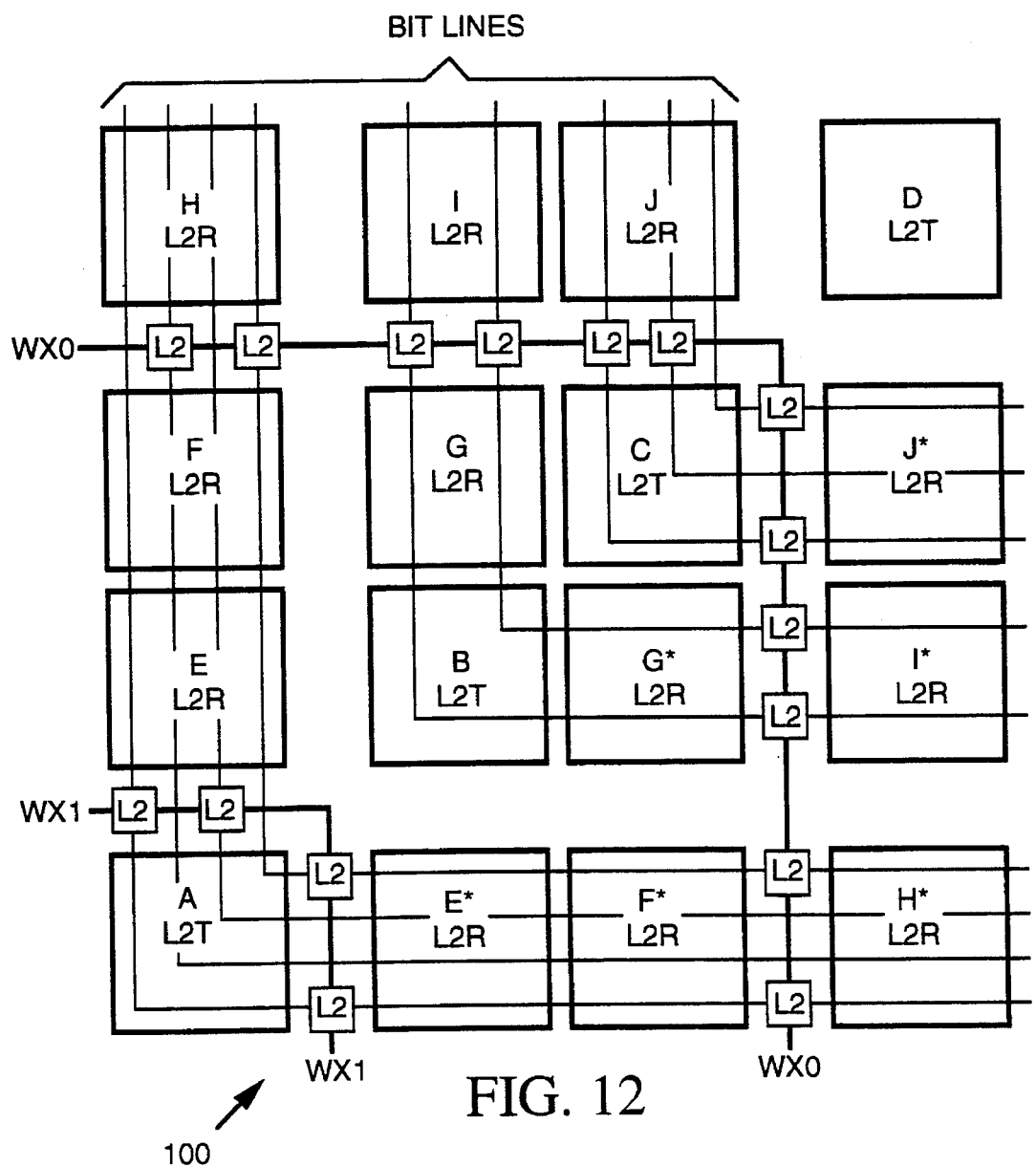
Figure 13:
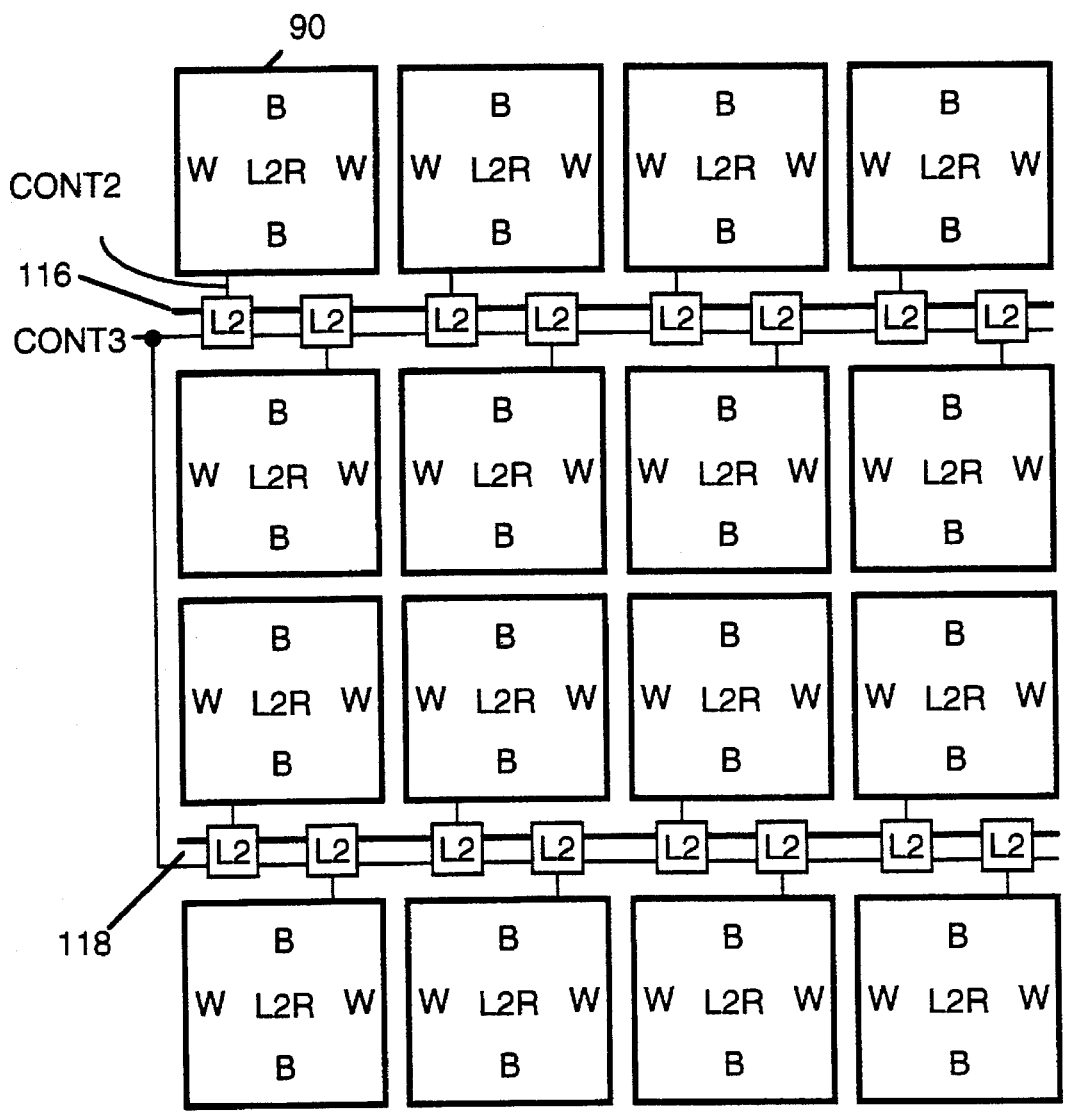
Figure 14:
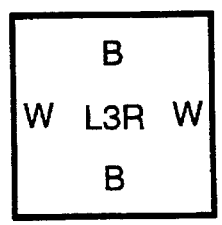
Figure 15:
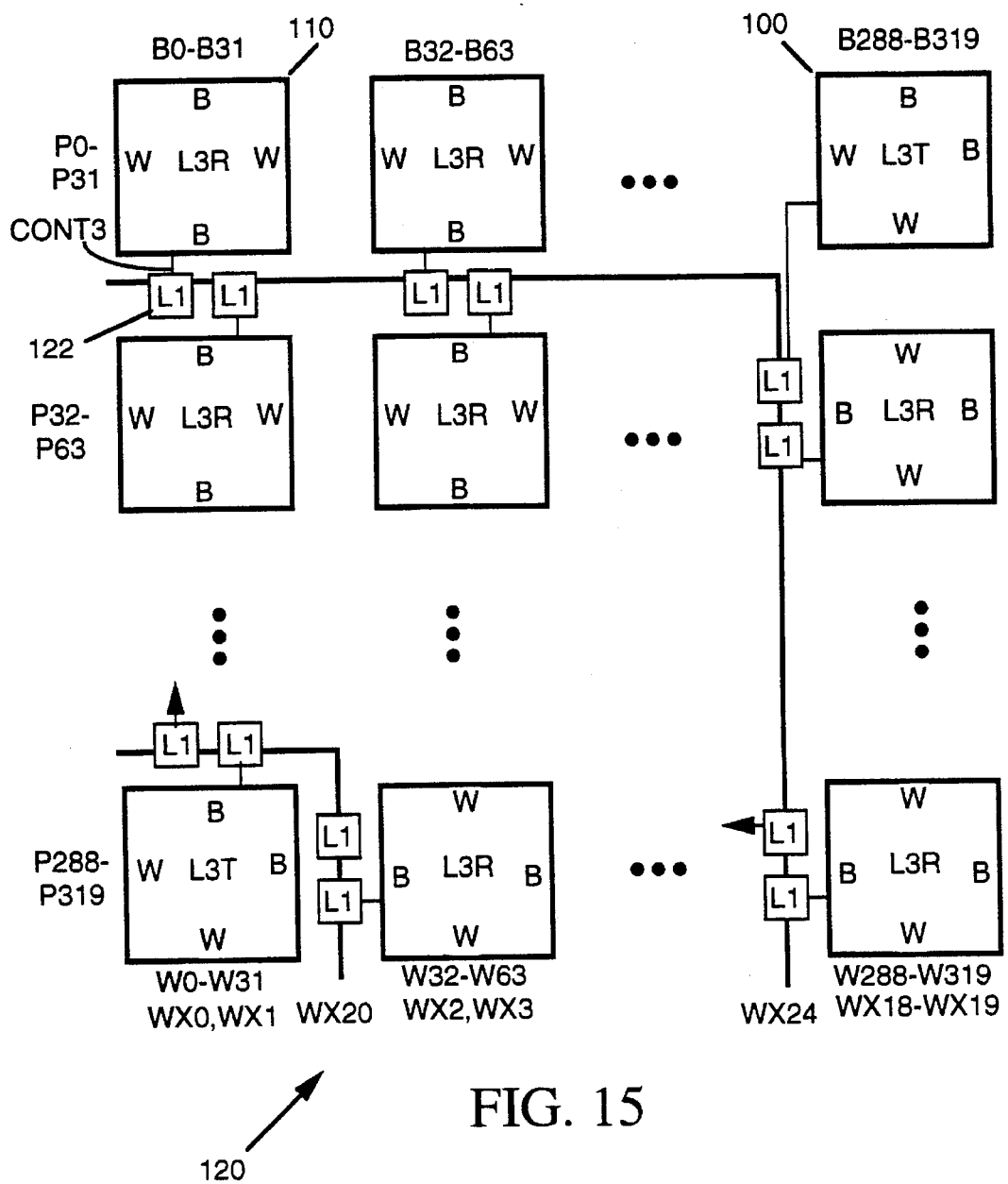

FIGS. 4A and 4B, when superimposed, form a block diagram of a two-level, folded triangular crosspoint array in accordance with the present invention;

FIG. 4C is a diagram representing an integrated circuit cell layout of the crosspoint array of FIGS. 4A and 4B;

FIG. 5 is a symbol depicting the folded triangular crosspoint array of FIGS. 4A and 4B;

FIGS. 6 and 7 are block diagrams of switch cells forming the crosspoint array of FIGS. 4A and 4B;

FIG. 8 is a two-level, 8 by 4 rectangular crosspoint array in accordance with the present invention;

FIG. 9 is a symbol depicting the rectangular crosspoint array of FIG. 7;

FIG. 10 is a block diagram of a three-level, folded crosspoint array formed by the two-level triangular and rectangular crosspoint arrays of FIGS. 4A/4B and 8;

FIG. 10A is a block diagram depicting how buses may be connected to the crosspoint array of FIG. 10;

FIG. 10B is a block diagram illustrating a typical second level control cell of FIG. 10;

FIG. 11 is a symbol depicting the crosspoint array of FIG. 10;

FIG. 12 is a block diagram illustrating routing of selected word and bit lines through the crosspoint array of FIG. 10;

FIG. 13 is block diagram of a three-level folded, rectangular crosspoint array in accordance with the present invention;

FIG. 14 is a symbol depicting the three-level folded, rectangular crosspoint array of FIG. 13; and FIG. 15 is a block diagram illustrating a four-level crosspoint array in accordance with the present invention.

DESCRIPTION OF THE PREFERRED EMBODIMENT(S)

FPID Layout

Figure 1:
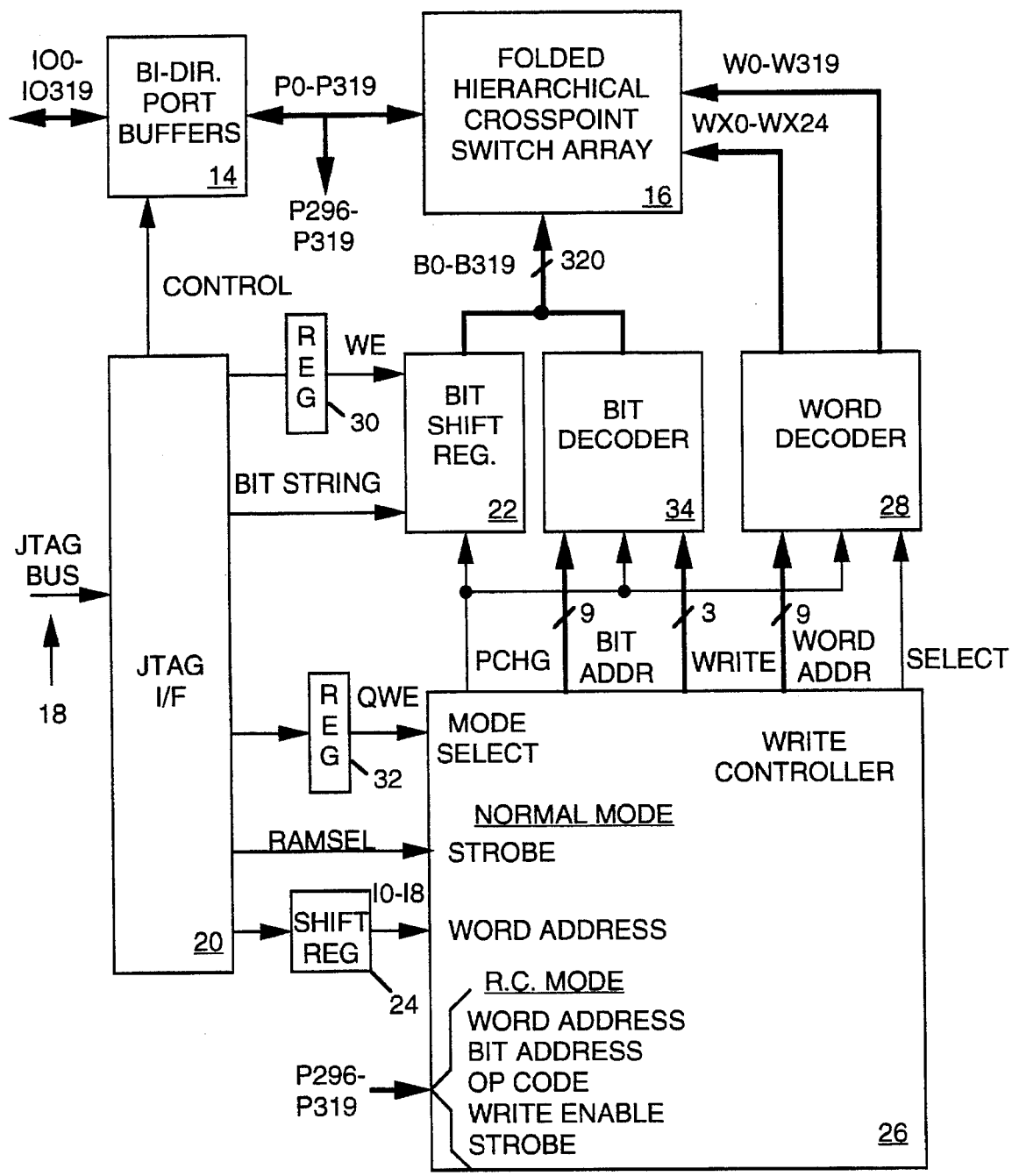
FIG. 1 is a block diagram illustrating a field programmable interconnect device in accordance with the present invention.

FIG. 1 is a block diagram of a field programmable interconnect device (FPID) 10 in accordance with the present invention. FPID 10 interconnects selected pairs of input/output (I/O) lines IO0–IO319 to provide uni-directional or bi-directional signal paths therebetween. In the preferred embodiment of the invention FPID 10 may interconnect up to 320 I/O lines, however in alternative embodiments FPID 10 may handle a larger or smaller number of I/O lines. FPID 10 includes a set of buffers 14 for buffering signals between the I/O lines and a corresponding set of ports P0–P319 of a folded, hierarchical, crosspoint switch array 16. Buffers 14 are bi-directional in that they can buffer signals in either direction between the I/O lines IO0–IO319 and corresponding ports P0–P319. Buffers 14 automatically sense the direction of signal flow and provide buffering in the sensed direction. They do not require externally generated direction indicating signal. Buffers 14 are described in detail in U.S. Pat. No. 5,202,593, titled BI-DIRECTIONAL BUS REPEATER, issued Apr. 13, 1993 to Huang et al and incorporated herein by reference.

Crosspoint switch array 16 selectively routes bi-directional signals between pairs of ports P0–P319. Array 16 comprises an array of switching cells, one cell corresponding to each possible pair of ports P0–P319. Each switching cell of array 16 includes a single bit memory cell and a pass transistor switch. When the switch is closed, the corresponding pair of ports P0–P319 are interconnected and signals may pass bi-directionally therebetween. The state of a bit stored in the memory cell within each switching cell determines whether the switch is closed. The switch memory cells are arranged to form a 320×320 static random access memory (SRAM). A separate one of 320 word lines W0–W319 is supplied to each of 320 rows of memory cells and a separate one of 320 bit lines B0–B319 is supplied to each of 320 columns of memory cells within array 16. In the preferred embodiment each memory cell is an SRAM cell and each bit "line" actually requires two conductors and conveys a differential signal indicating a state of a bit to be stored in the array. However other types of memory cells well known in the art may be employed. When one of word lines W0–W319 is asserted, one row of memory cells is selected and data bits appearing on separate ones of the 320 bit lines are written into the separate memory cells of the selected row. Thus the switching state of array 16, the connections that it makes between ports P0–P319, may be established using 320 memory write operations, where each write operation writes a 320 bit word appearing on bit lines B0–B319 to a separate one of the 320 rows of memory cells in array 16.

Normal Mode Operation

In a "normal" mode of operation, data for controlling operation of FPID 10 is transferred in serial fashion from an external controller such as a host computer to FPID 10 via an IEEE standard 1149.1 "JTAG" bus 18. A typical JTAG interface circuit is taught in U.S. Pat. No. 5,282,271 titled I/O BUFFERING SYSTEM TO A PROGRAMMABLE SWITCHING APPARATUS issued Jan. 25, 1994 to Wen-Jai Hsieh et al, incorporated herein by reference. A JTAG interface circuit 20 is a serial interface which receives and executes incoming instructions on JTAG bus 18. These instructions tell the JTAG interface circuit 20 to store data conveyed on the JTAG bus 18 in registers within FPID 10 at register addresses conveyed therewith. Some of these instructions tell the JTAG interface circuit 20 to store data in registers within buffers 14. This data controls operation of buffers 14, including for example whether a buffer 14 level shifts, blocks or inverts its input. Other instructions received on the JTAG bus 18 also convey data for programming array 16.

To write a 320-bit data word into array 16, the host computer serially transmits a 320 bit string (BIT STRING) to interface circuit 20 via JTAG bus 18 along with commands telling the JTAG I/F circuit 20 to serially shift BIT STRING into a shift register 22. The host computer next uses the JTAG bus 18 to serially transmit a 9-bit word address I0–I8 to interface circuit 20 along with control and address bit telling circuit 20 to load that word into another shift register 24. In the normal mode of operation, a write controller circuit 26 passes the data in register 24 as a 9-bit word address (WORD ADDR) to a word decoder 28. The host computer then sends an instruction to interface circuit 20 telling it to store a logically true WE (write enable) bit in a register 30. The WE bit in register 30 is supplied to shift register 22. Finally, the host computer sends an instruction to JTAG interface circuit 20 telling it to transmit a RAMSEL signal to write controller 26.

Controller 26 responds to the RAMSEL signal by asserting an output SELECT signal supplied to word decoder 28. Decoder 28 responds to the SELECT signal by decoding the 9-bit WORD ADDR to determine which of the word lines W0–W319 is being addressed. Controller 26 then pulses a precharge signal (PCHG) telling word decoder 28 to assert the addressed word line. The PCHG signal also tells shift register 22 to latch its stored 320-bit data onto the bit lines B0–B319 when the shift register 22 is output enabled by the WE signal. When controller 26 thereafter deasserts the SELECT signal, the 320-bit data appearing on the BIT LINES are stored in the particular row of memory cells accessed by the selected one of word lines W0–W319.

A host computer may need to change only the bit stored in the memory of a single crosspoint array cell, thereby to make or break a single connection between two specific FPID I/O ports P0–P319. However, to do so in the normal mode of FPID 10 operation, the host computer must not only write the bit to the memory cell of interest, but must write bits into all 320 cells of the row containing the cell of interest. Thus in the normal mode of operation, making or breaking a single connection between two FPID I/O ports P0–P319 requires a substantial number of clock cycles on the serial JTAG bus 18.

Rapid Connect Mode Operation

In accordance with the present invention, FPID 10 operates in an alternative "rapid connect" mode of operation which permits a host computer to access FPID 10 via a parallel bus and to write a bit into a single memory cell of array 16 in a single cycle of that parallel bus. In the preferred embodiment of the invention, the parallel bus comprises I/O lines IO296–IO319 which otherwise access ports P296–P319. However, in alternative embodiments, the parallel bus may use separate dedicated FIPD input ports not connected to array 16. Before entering the rapid connect mode, memory cells within switch array 16 should be programmed using the normal mode of operation. Since the rapid connect mode makes use of ports P296–P319 for conveying programming information, these ports should not be used for other purposes when the FPID is to operate in the rapid connect mode. Thus switch array 16 should not be programmed to connect any of ports P296–P319 to any other ports when the rapid connect mode is in use.

Ports P296–P319, accessed via I/O lines IO296–IO319 and buffers 14, form a 24-bit parallel bus for conveying an instruction to write controller 26 from a host computer or other control data source. Table I lists the information conveyed by that 24-bit instruction.

TABLE I

| BITS | PURPOSE |
| --- | --- |
| P296–P304 | Word address |
| P305 | Unused |
| P306–P314 | Bit address |
| P315 | Unused |
| P316–317 | Operation code |
| P318 | Write Enable |
| P319 | Strobe |

The word (line) address (P296–P304) is a 9-bit value indicating the word line for write enabling a memory cell of interest. Bit P305 is unused. The bit (line) address (P306–P314) is a 9-bit value indicating a particular bit line (B0–B319) leading to the memory cell of interest. Bit P315 is unused. The operation code (P316–P317) is a 2-bit value indicating a particular action to be taken. The four possible actions are listed below in Table II.

TABLE II

| P316 | P317 | Action |
| --- | --- | --- |
| 0 | 0 | Write "0" to cell of interest and to all other cells of row of interest |
| 0 | 1 | Write "1" to cell of interest and "0" to all other cells of row of interest |
| 1 | 0 | Write "0" to cell of interest, leave contents of all other cells unchanged |
| 1 | 1 | Write "1" to cell of interest, leave contents of all other cells unchanged |

The write enable signal (P318) is held low to enable the operation code to be written into controller 26 of FIG. 1. The strobe signal (P319) is asserted to initiate a memory write operation when the word and bit address and the operation code are delivered to controller 26.

When the FPID is in the normal mode of operation a QWE bit of logic state "0" is stored in register 32. To enter the rapid connect mode, the host computer transmits via the JTAG bus an instruction telling JTAG I/F circuit 20 to set the state of the QWE bit in a register 32 to a logical "1". This tells controller 26 to operate in the rapid connect mode rather than in the normal mode. Thereafter to change the state a bit stored in a single memory cell of interest within array 16, the host computer transmits a parallel data word to controller 26 including a word address via ports P296–P304, a bit address to controller 26 via ports P306–P314, and an appropriate operation code via ports P316–P317. While holding the write enable bit P318 low, the host computer pulses a strobe input of controller 26 via port P319, thereby to initiate a memory write operation.

Controller 26 responds to the pulse at its strobe input by forwarding the 9-bit word address to word decoder 28 and the 9-bit bit address to a bit decoder 34. The controller 26 then asserts (pulls low) the SELECT signal to write the word address into word decoder 28. Thereafter controller 26 transmits a 3-bit WRITE strobe signal to bit decoder 34. Bit decoder 34 controls the bit lines B0–B319 of switch array 16. The WRITE strobe signals indicate whether bit decoder 34 is to set the bit line leading to the memory cell of interest to a logical "1" or a logical "0". The WRITE strobe signals also indicate whether the bit decoder 34 is to drive the remaining 319 bit lines to a logical "0" or let them float. Controller 26 then pulses the PCHG signal transmitted to word decoder 28 and bit decoder 34 telling them to decode the word and bit addresses. The word decoder 28 asserts a particular one of word lines W0–W319 thereby to write enable a selected row of memory cells for receiving data appearing on the bit lines. Bit decoder 34 drives high or low the particular one of bit lines B0–319 leading to the memory cell column of interest, thereby to set the bit stored in the cell of interest to a logical "1" or "0" as indicated by the WRITE strobe signals. Also, depending on the operation requested by the WRITE strobe signals, bit decoder 34 may also either pull low all other bit lines or let them float. If these bit lines float, the data bit values previously stored in all memory cells of the row of interest (other than the cell of interest) remain unchanged. If the WRITE strobe signal tells the bit decoder 34 to pull the other bit lines low, then the bits stored in all these other memory cells of the row of interest are set to logical "0". Thereafter, when controller 26 deasserts the SELECT signal, the rapid connect operation is complete.

Thus the rapid connect operation requires only a single cycle of the parallel "bus" formed by ports P296–P319 and allows the host computer to take one of two actions. It can set a bit of any particular memory cell of any particular row of array 16 to a "1" or a "0" while leaving the states of bits in all other memory cells unchanged. The host computer can also set the bit of the particular memory cell in array 16 to a "1" or a "0" while setting the bits in all other memory cells of the particular row to 0. This means that the host computer can, in a single cycle of the parallel bus P296–P319, make or break any individual connection between the remaining ports P0–P295 and can, if desired, break all connections between ports P0–P295 formed by cells of the particular array row.

The rapid connect mode is particularly useful, for example, when FPID 10 is being used as a hub for routing data to a printer connected to port P0 from a set of computers connected to various ports P1–P295. The printer port P0 may be connected to any other port via cells along one row of array 16. In one cycle of bus P296–P319, an external controller may break any existing connection between the printer and a computer and make a new connection between the printer and another computer. In the normal mode of operation, such an operation would require several hundred cycles of JTAG bus 18.

Configuration Controller

Figure 2:
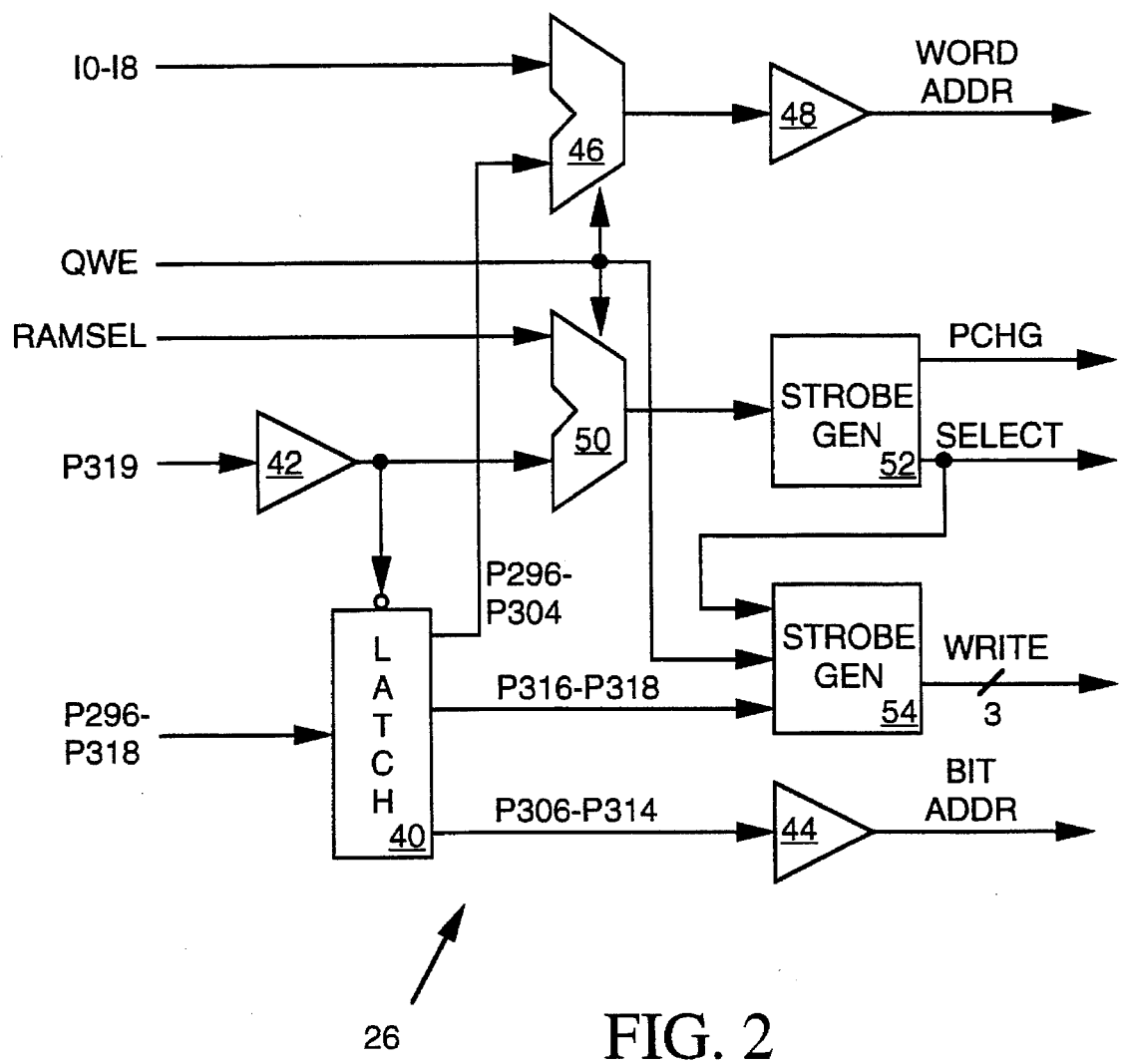
FIG. 2 is a block diagram illustrating details of the write controller of FIG. 1.

FIG. 2 illustrates write controller 26 of FIG. 1 in more detailed block diagram form. The word and bit address, the operation code and enable bits on parallel bus lines P296–P318 arrive at a latch 40 operated by the strobe signal on bus line P319 via a buffer 42. The bit address on P306–P314 is latched onto the input of another buffer 44, the output of which is delivered to bit decoder 34 of FIG. 1. The word address arriving via ports P296–P304 is latched onto the input of a multiplexer 46 while the word address I0–I8 provided by shift register 24 of FIG. 1 is supplied to a second input of multiplexer 46. The QWE signal from register 32 of FIG. 1 controls multiplexer 46 and selects one of the word addresses appearing on I0–I8 or P296–P304 for transmission to a buffer 48 depending on whether the FPID is operating in the normal or rapid connect mode. Buffer 48 forwards the selected word address to word decoder 28 of FIG. 1. A second multiplexer 50, also controlled by the QWE signal, selects the RAMSEL signal from JTAG interface circuit 20 of FIG. 1 and forwards it to a strobe signal generator 52 when the FPID is operating in the normal mode. In the rapid connect mode, multiplexer 50 selects the P319 signal output of buffer 42 and forwards it to strobe generator 52. On receipt of the RAMSEL or P319 signal, strobe generator 52 generates the SELECT signal transmitted to word decoder 28 of FIG. 1 and the PCHG signal transmitted to shift register 22, word decoder 28 and bit decoder 34 of FIG. 1.

The SELECT signal output of strobe generator 52 also provides an input to another strobe generator 54 which produces the three WRITE strobe signals supplied to bit decoder 34 of FIG. 1. Strobe generator 54 operates only in the rapid connect mode and is disabled by the QWE signal when the FPID is operating in the normal mode. In the rapid connect mode, strobe generator 54 generates the WRITE strobe signals in accordance with to the operation selected by the P316–P317 operation code output of latch 40, provided write enable bit P318 is held low.

Switch Array

Switch array 16 of FIG. 1 includes a set of switch cells, each of which includes a pass transistor for interconnecting a pair of ports P0–P319 when enabled, and a single bit memory for storing a bit controlling the switch. Array 16 is a type of "triangular" array insofar as it is able to interconnect any two ports P0–P319 using only a single switch cell. As described below, the layout of array 16 on an integrated circuit is "folded" in a way that requires less integrated circuit surface area than a conventional triangular crosspoint array. Also, as described herein below, array 16 is "hierarchical" in that switch cells therein are organized into a hierarchy of subarrays, with a control cell provided for each subarray. A data bit stored in each control cell indicates whether all switching cells of an associated subarray are enabled to respond to the bits they store in their memories. The control cells provide multiple levels of control over array 16 whereby large blocks of switch cells can be controlled by writing a single bit to corresponding control cells.

FIG. 3A illustrates a prior art 8-port triangular crosspoint switch array. Each of a set of switch cells S are arranged into a triangular array selectively. Each cell S includes a switch for interconnecting a pair of ports P0–P7 and a single bit memory for storing a bit controlling the state of the switch. Each cell appears at the intersection of one of word lines W0–W7 and one of bit lines B0–B7. The bit may be written into any cell S by placing the bit on the bit line leading to the cell and strobing the word line leading to the cell. The triangular array of FIG. 3A can connect any port to any other port through only a single pass transistor, but it makes inefficient use of integrated circuit space.

FIG. 3B is a block diagram of a typical prior art switch cell S of FIG. 3A. A switch 56 interconnecting ports X and Y is controlled by a bit stored in a memory cell 58. The bit is delivered to cell 58 via a bit line and written into memory 58 in response to a pulse on the word line.

FIG. 3C is a schematic diagram of a typical SRAM prior art switch cell S of FIG. 3A comprising transistors M1–M7. The "bit" is delivered to the cell via a differential signal, and therefore, in the preferred embodiment the bit "line" actually requires two conductors BM and BP. The word line W controls transistors M6 and M7. If BM is driven low and BP is driven high when the word line W is pulsed, M1 and M4 turn off and M2 and M3 turn on, thereby turning M5 on to provide a signal path between X and Y. If BM is driven high and BP is driven low when the word line W is pulsed, M1 and M4 turn on and M2 and M3 turn off, thereby turning M5 off to break the signal path between X and Y. If BM and BP are allowed to float while the word line W is pulsed, the switching states of M1–M5 remain unchanged.

FIGS. 4A and 4B, when superimposed, form a block diagram illustrating an integrated circuit layout of a "folded, hierarchical, triangular" crosspoint array 60. Array 60 is a building block for the crosspoint array 16 of FIG. 1. Array 60 uses the same number (28) of switch elements as the triangular crosspoint array of FIG. 3 and provides the same routing capability of the prior art triangular crosspoint array insofar as it can connect any port P0–P7 to any other port P0–P7 through a pass transistor in only a single switch element L1. However the folded triangular crosspoint array 60 is arranged differently so that it is more compact and consumes less space in an integrated circuit chip. Also the switch elements L1 of array 60 differ from switch elements S of array of FIG. 3 in a way that makes array 60 suitable for use as a building block for a "hierarchical" crosspoint array. As discussed herein below, a hierarchical crosspoint array can more rapidly change interconnections between buses than a conventional triangular crosspoint array.

Array 60 of FIGS. 4A and 4B includes two sets of four "horizontal" I/O lines 66 and 68 and one set of eight "vertical" I/O lines 67. Pairs of I/O lines 67 and 68 are interconnected at nodes 61 where they intersect along a main diagonal. A set of bit lines B0–B7 enter the right side of array 60, turn 90 degrees near the main diagonal and then depart at the top of array 60. A set of four word lines W0, W1, W2, and W3 enter at the left of array 60 while a second set of four word lines W4, W5, W6, and W7 enter at the bottom of array 60. Crosspoint array 60 is made up of four basic types Of cells 62–65. Switch connections between horizontal and vertical I/O lines are provided by "Level 1" switching cells L1 included in cell types 62 and 63.

Like the switching cells S of FIG. 3, the level one cells L1 make or break connections between pairs of ports in response to data bits stored therein. Also the data bits are loaded into the memories of the switching cells L1 using the bit and word lines in the same fashion as the cells S of the triangular array of FIG. 3. However, the L1 cells have an additional control input CONT2. That CONT2 control input operates as a "second level" of control over the switching operation of the L1 cells, the data bit stored in each L1 cell providing the first level of control. When the CONT2 is high, the L1 cells make or break connections between their respective port pairs according to the state of their stored bits. However when the CONT2 is low, each L1 cell breaks its port connection regardless of the state of the bit stored in its memory. Since CONT2 signal is supplied in parallel to all L1 cells of array 60, an external controller driving CONT2 can quickly break all connections of the array without having to alter the data stored in any of the 28 L1 cells.

FIG. 4C illustrates how the various cell types 62–65 are arranged on an integrated circuit. Cell type numbers marked with an asterisk (*) are turned 90 degrees clockwise and are mirror images of similarly numbered cells not marked with an asterisk (*). As formed in a common plane in an integrated circuit, cells 62–65 are all rectangular with substantially a 2/1 aspect ratio, each cell having two opposing sides that are substantially twice as long as their adjacent sides. However the crosspoint array 60 that they form covers a substantially square area in the common plane of the integrated circuit.

FIG. 5 symbolically depicts the folded, triangular crosspoint array 60 of FIGS. 4A and 4B. This symbol L2T is used herein when illustrating array 60 as a subarray building block for a larger crosspoint array. In FIG. 5, the symbol for array 60 is labeled "L2T" for "Level 2 Triangular". The "B's" and "W's" along the cell sides indicate where bit and word lines enter/depart the array.

FIG. 6 illustrates a level 1 cell type 62. This cell includes three I/O lines 66, 67 and 68 for carrying signals between ports. I/O lines 66 and 68 extend across the cell in its narrower dimension while I/O line 67 extends across the cell in its wider dimension, orthogonal to I/O lines 66 and 68. Cell 62 also includes a bit line 70 extending across the cell in parallel with I/O line 67 and a word line 75 extending across the cell in parallel with I/O lines 66 and 68. Bit line 66 is actually two conductors since it conveys a differential signal. Control line CONT2 crosses the cell in parallel with I/O line 67.

Cell 62 includes a switch 74 to selectively interconnect orthogonally disposed I/O lines 66 and 67 and a memory 76 to store a single control bit conveyed on bit line 70 in response to a pulse on word line 75. Switch 74 is suitably a pass transistor having signal terminals connected between lines 66 and 67 and having a control terminal driven by the CONT1 signal. Cell 62 includes a logic circuit 78 interposed between memory 76 and switch 74. Logic circuit 78, suitably an AND gate, receives the output signal 80 produced by memory 76 indicating the state of its stored bit. Logic circuit 78 also receives the externally generated control signal CONT2 and generates a logic signal CONT1 for controlling the operation of switch 74. When signal 80 indicates that the bit stored in memory 76 is true and control signal CONT2 conveys a true bit, logic circuit 78 signals switch 74 to create a signal path between I/O lines 66 and 67. However if the bit in memory 76 is false or if the bit value conveyed by control signal CONT2 is false, logic circuit 78 signals switch 74 to break the signal path between I/O lines 66 and 67. Schematically cell 62 is similar to cell S of FIG. 3 except that additional pass gates controlled by CONT2 are inserted between M6 and M2 and between M7 and M3 to implement logic circuit 78.

FIG. 7 illustrates a level one cell type 63. This cell also includes three I/O lines 66, 67 and 68 for carrying signals between ports. Port lines 66 and 68 extend across the cell in its narrow dimension while I/O line 67 extends across the cell in its wider dimension, orthogonal to I/O lines 66 and 68. I/O lines 67 and 68 are permanently interconnected where they intersect at node 61. Cell 63 includes a bit line 70 providing data input to memory 76. Bit line 70 enters the right side of the cell, turns 90 degrees and then extends to the top of the cell. A word line 75 enters on the left side of the cell and terminates at memory 76. Control line CONT2 crosses the cell in parallel with I/O line 67 and also provides input to logic circuit 78. The memory, logic and switch circuits of FIG. 7 operate in a manner similar to those of FIG. 6 so as to provide selective control over interconnections between I/O lines 66 and 67.

FIG. 8 is a block diagram depicting a 4×8 rectangular crosspoint array 90. Array 90 is used with the folded triangular array of FIGS. 5A and 5B as building block subarrays for constructing a larger crosspoint array. Array 90 is a 4×8 array of switching cells 62 of the type illustrated in FIG. 6.

FIG. 9 symbolically depicts the folded rectangular crosspoint array 90 of FIGS. 5A and 5B. In FIG. 9, the symbol for array 90 is labeled "L2R" for "Level 2 Rectangular" and also marked with "B's" and "W's" on the cell sides where bit lines ("B") and word lines ("W") enter and depart the cell.

FIG. 10 is a block diagram of the integrated circuit layout of a three-level, hierarchical crosspoint array 100. Crosspoint array 100 may be used as a 32 port crosspoint switch. The three-level crosspoint array 100 includes a 4×4 array of Level 2 cells, where each Level 2 cell is either a triangular crosspoint array L2T similar to that shown in FIGS. 4A and 4B or a rectangular crosspoint array L2R similar to that shown in FIG. 8. The Level 2 triangular cells A–D are positioned along the main diagonal of the array while the Level 2 rectangular cells E through J and E* though J* comprise the remaining Level 2 cells of array 100. For simplicity, FIG. 10 shows only two of the eight I/O lines entering/leaving each edge of each Level 2 cell and shows none of the word and bit lines. The routing of bit and word lines though the array is indicated by the "W" and "B" labels on the edges of the Level 2 cell symbols. The I/O lines follow paths adjacent to the word lines. Note that the rectangular cells E*–J* are rotated 90 degrees from their "complement" rectangular cells E–J. Their corresponding control cells will also be addressed by the same word and bit lines.

In addition to the Level 2 switching cells of the type L2T and L2R, crosspoint switch 100 also includes a set of Level 2 control cells L2. Each of these Level 2 control cells L2 produces a separate Level 2 control signal CONT2 in response to an input Level 3 control signal CONT3 and a data bit stored in the control cell L2. The CONT2 signal from each control cell L2 is supplied in parallel to every first level switching cell within a corresponding second level switching cell L2R or L2T.

Referring again to FIGS. 6 and 7 illustrating individual first level switching cells, the CONT2 signal is supplied to logic circuit 78. When that signal is false, logic circuit 78 inhibits switch 74 from interconnecting I/O lines 66 and 67 even when the bit in memory 76 otherwise indicates the switch should connect the I/O lines.

Referring back to FIG. 10, when bits in all Level 2 control cells L2 are true, crosspoint array 100 acts like a conventional 32 port triangular crosspoint array insofar as it can selectively interconnect any two of its 32 ports through only a single switch cell. The connections are controlled entirely by the data stored within the individual Level 1 switching cells within each Level 2 crosspoint array L2T or L2R and their complements. However by selectively setting data bits stored in second level control cells L2 false, the I/O line interconnection activity of entire second level subarrays L2T or L2R and their complements can be inhibited regardless of the data stored in the memories of their first level switching cells L1. Thus while the data stored in the memory of an individual first level switching cell L1 within each subarray L2R or L2T and their complements can determine whether or not two individual ports are interconnected, the data bit stored in a second level control cell L2 may be used to concurrently control switch operation of all first level cells within a corresponding second level array L2T or L2R and their complements. Level 2 control cells L2 thus provide a second level of control over switching activity of the hierarchical crosspoint array 100.

The crosspoint array 100 of FIG. 10 is particularly suited to rapidly switching connections between a set of eight-bit buses. For example as illustrated in FIG. 10A, assume an eight bit computer bus BUSW is connected to ports P0–P7 along the bottom of array 100 and eight bit buses BUSX, BUSY and BUSZ from three different peripheral devices were connected to ports P8–P15, P16–P23, and P24–P31, respectively, along the three remaining sides of array 100. Assume BUSW is initially connected to BUSZ through Level 1 cells within Level 2 subarrays H and H*. We could switch BUSZ from BUSW to BUSX by first changing the data stored in the memories of Level 1 switching cells within subarrays H and H* to disconnect BUSW from BUSZ. We could then change data in the Level 1 cells within Level 2 subarrays F and F* to connect BUSX to BUSZ. However changing data in so many Level 1 switching cells would require much time, particularly when this control data must pass through a serial JTAG bus on the way to the crosspoint array.

On the other hand, suppose first level memories within second level subarrays H and H* were initially programmed to connect BUSW to BUSZ and memories of Level 1 switching cells within Level 2 subarrays F and F* were initially programmed to connect BUSX to BUSW. If data stored in Level 2 control cells L2 initially inhibited switching activity of all second level subarrays except subarrays H and H*, BUSW would initially be connected to BUSZ. Even though the other Level 2 subarrays are programmed to connect BUSW to BUSX and BUSY, false data bits in the second level control cells L2 inhibits them from actually doing so. To switch BUSW from BUSZ to BUSX, we need only change the four data bits stored in the Level 2 control cells L2 which control the four second level subarrays H, H*, F and F*. We can thereafter switch BUSW from BUSZ to BUSX or back to BUSZ with the same speed simply by changing the data stored in only a relatively few second level control cells L2.

Note that since subarrays and their complements (e.g. H and H*) are always switched simultaneously, we can assign their control cells the same word/bit address, thereby further reducing switching time. Thus the hierarchical crosspoint array 100 of FIG. 10 can be used to rapidly switch buses by first storing data indicating the various bus switching patterns in the Level 1 switching cells and then using the Level 2 control cells to select from among those predetermined patterns.

FIG. 10B is a block diagram illustrating a typical second level control cell L2 of FIG. 10. Cell L2 includes a single bit memory 104 and a logic circuit 102, suitably an AND gate. Memory 104 stores a bit on a bit line 106 in response to a pulse on word line 108 and produces an output signal 109 indicating the state of the stored bit. Logic circuit 102 receives output signal 109 and also receives an externally generated control signal CONT3. If the bit stored in memory 104 is true, and if the CONT3 signal is true, logic circuit 102 produces an output CONT2 signal of true state. If the bit stored in memory 104 is false or if the CONT3 signal is false, then logic circuit 102 sets CONT2 false.

Referring again to FIG. 10, the CONT3 signal is an externally generated signal that is supplied in parallel to every level 2 control cell L2. Thus if the CONT3 signal is false, all of the second level cells of array 100 are inhibited from interconnecting ports P0–P31. Thus the Level 3 switching array 100 of FIG. 10 has three levels of switching control. The first level of control is provided by the data stored in the memories of the first level (L1) switching cells within each second level array L2R or L2T. The second level of control is provided by the data stored in the memories of the Level 2 control cells L2. If the CONT2 signal produced by a Level 2 control cell L2 is false, then the associated level 2 switching cell makes no interconnections regardless of the state of control bits stored in Level 1 switching cells L1 therein. The third level of control is provided by the externally generated CONT3 signal. If that signal is false, the entire array 100 is inhibited from interconnecting any of the ports P0–P31 regardless of the state of data in the Level 1 and Level 2 switch and control cells.

The three-level array 100 can be used as a building block subarray in a higher level folded crosspoint array. FIG. 11 is a symbol L3T for depicting the level three triangular crosspoint array 100 FIG. 10 when illustrating its use in a higher level array.

FIG. 12 is a block diagram illustrating routing of selected word and bit lines through the second level control cells L2 of the crosspoint array 100 of FIG. 10. For simplicity, the I/O lines, word lines, control lines and most of the bit lines for the Level 1 switch cells of L2R and L2T are not shown. The second level control cells L2 require only 2 additional word lines WX0 and WX1 for controlling storage of data therein. Word line WX0 passes through Level 2 control cells L2 associated with second level switching cells C and D as well as second level cells F, G, H, I, and J and their "complement" cells F*, G*, H*, I*, and J*. Word line WX1 accesses cells A, B, E and E*. The second level control cells L2 do not require additional bit lines but instead share bit lines servicing various Level 1 switching cells within adjacent Level 2 switch cell subarrays.

Note that the word lines WX0 and WX1 and bit lines turn 90 degrees along the main diagonal of crosspoint 100 and that word and bit lines can intersect each other at two locations. The Level 2 rectangular switching cells type L2R are 4×8 cells. In order to switch 8-bit blocks, it is helpful to enable and disable the second level rectangular switching cells and their complements concurrently in pairs. Accordingly each second level rectangular switching cell E–J shares the same bit and word lines with its complement rectangular cell E*–J*. Thus the same bit is stored in the Level 2 control cell L2 for each switching cell E–J as is stored in the control cell for its complement E*–J*. The switching operations of each second level cell and its compliment are therefore always concurrently enabled or disabled.

FIG. 13 is block diagram of the integrated circuit layout of a Level 3 folded, rectangular crosspoint array 110 in accordance with the present invention. Array 110 includes a 4×4 array of Level 2, folded rectangular crosspoint arrays 90 of the type illustrated in FIG. 8. For each second level switching cell 90 there is a second level control cell L2 of the type illustrated in FIG. 10B supplying a CONT2 signal to the second level cell 90. There are two rows of such second level control cells L2 and each row receives its own word line 116 or 118. Each second level control cell L2 receives one of the bit lines (not shown) passing through the second level switching cell 90 that it controls. All of the second level control cells L2 receive the same third level control signal CONT3.

FIG. 14 is a symbol L3R depicting the level 3 rectangular crosspoint array of FIG. 13. As discussed herein below, we can use the folded triangular crosspoint array 100 of FIG. 12 and rectangular crosspoint array 110 of FIG. 13 as subarray cells to build a four-level crosspoint array.

FIG. 15 is a block diagram of the integrated circuit layout of the four-level, folded, hierarchical crosspoint array 16 of FIG. 1 capable of switching 320 ports. Array 120 includes a 10×10 array of Level 3 cells, where each Level 3 cell is either a triangular crosspoint array 100 similar to that shown in FIG. 10 or a rectangular crosspoint array 110 similar to that shown in FIG. 14. Crosspoint array 120 also includes a set of Level 3 control cells L3 each providing a CONT control signal 124 to a corresponding third level crosspoint array L3R or L3T. Not all 100 level three cells of array 120 are shown but the 10×10 arrangement of third level cells in the four-level array 120 of FIG. 15 follows a pattern similar to the 4×4 arrangement of second level cells in the three-level array 100 of FIG. 10. Array 120 can be used for rapidly switching, for example 8-bit or 32-bit buses connected to its ports by loading data into the Level 1 switching cells defining the desired switching patterns and by using the appropriate level control cells to select the desired swathing pattern. Word lines WX0–WX24 provide write control access to the various cells that control level 2 and higher level switch operation.

Hierarchical Control in Rapid Connect Mode

Referring back to FIG. 1, word decoder 28 also controls the WX0–WX24 hierarchical word lines, word lines WX0–WX24 being in the same address space as lines W0–W319. Note that various ones of bit lines B0–B319 access control cells as well as switching cells within array 16. Thus a host computer may use either the normal or rapid connect modes of operation not only to access switching cell memories within array 16 but also to control cell memories.

The rapid connect mode of controlling a hierarchical switch array is particularly advantageous when FPID 10 is used for switching between a set of parallel buses, for example between a computer and several peripheral devices. The normal mode of operation is used to initially program various subarrays of FPID such that each subarray, when enabled by a bit in its control cell, interconnects a separate pair of the buses. Thereafter a host computer may switch bus interconnections by appropriately enabling and disabling the various subarrays using the rapid connect mode to alter data stored only in the relatively few control cells that control the arrays. For example to switch a computer bus from one peripheral device to another requires only two cycles of the rapid connect bus. A first cycle of the rapid connect bus writes a single bit to a control cell to inhibit the subarray connecting the computer to the first peripheral device. A second cycle of the rapid connect bus writes a single bit to a second control cell which enables a subarray connecting the computer to the second peripheral device.

Thus has been shown and described an improved field programmable interconnect device in accordance with the present invention. The FPID employs a folded crosspoint array that uses minimal substrate surface area when implemented as an integrated circuit. Crosspoint array control is hierarchical so that switching operation of large groups of switching cells within the array can be inhibited or enabled by writing data to only a relatively few control cells. The FPID provides for normal and rapid connect programming modes. The normal mode allows large blocks of programming data to be written into the array via a serial input port. The rapid connect mode provides rapid write access to individual cells within the array, including both switching and control cells, so that individual connections between the various ports of the FPID can be rapidly enabled or inhibited. The use of hierarchical control, in combination with the rapid connect mode of operation, allows the FPID to be used for rapidly switching buses.

While the forgoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

We claim:

1. A programmable interconnect device for routing signals between signal ports in response to data from an external controller, the device comprising:

switch means having a plurality of said signal ports, having memory means for storing a set of data bits, each data bit having a state indicating whether said switch means is to convey a signal between a separate pair of said signal ports associated with said data bit, and having means for conveying signals between each pair of signal ports when indicated by the state of the data bit associated with said pair of signal ports; and programming means for receiving said set of data bits in serial form from said external controller and storing the received set of data bits in said memory means, for receiving a multiple bit parallel data word from said external controller, said parallel data word identifying a particular bit of said set of data bits stored in said memory means and indicating a state to which said particular bit is to be set, and for setting said particular bit stored in said memory means to the indicated state.

2. The programmable interconnect device in accordance with claim 1 wherein a portion of said signal ports are coupled to said external controller and to said programming means and wherein said programming means receives said parallel data word from said external controller via said portion of said signal ports.

3. The programmable interconnect device in accordance with claim 1 wherein said switch means comprises a crosspoint switch array.

4. The programmable interconnect device in accordance with claim 1 wherein said switch means comprises a folded crosspoint array comprising:

a plurality of switch cells, each switch cell occupying a separate rectangle in a common plane of an integrated circuit, said rectangle having parallel first edges and adjacent second edges, said first edges being substantially longer than said second edges, each cell comprising a first conductor extending between said second edges of said rectangle, a second conductor extending between said second edges of said rectangle, a first memory cell for storing a separate one of said data bits, and means coupled to said first and second conductors and said first memory cell for selectively providing a signal path between said first and second conductors in response to a state of said separate one of said data bits.

5. The programmable interconnect device in accordance with claim 4 wherein said switch cells abut one another to form substantially a square in said common plane.

6. The programmable interconnect device in accordance with claim 4 wherein said first edges are substantially twice as long as said second edges.

7. The programmable interconnect device in accordance with claim 1 further comprising:

a plurality of input/output (I/O) ports, and bi-directional buffer means connected for bi-directionally buffering signals between said I/O ports and said signal ports.

8. The programmable interconnect device in accordance with claim 1 wherein said switch means comprises:

said plurality of signal ports;

a plurality of pass devices, each pass device being connected to a separate pair of said signal ports for providing a signal path therebetween when said pass device is enabled;

a plurality of memory cells, each memory cell being associated with a separate one of said pass devices and storing a separate one of said data bits; and means for selectively either enabling or disabling each said pass device in accordance with a state of a data bit stored in a corresponding one of said memory cells.

9. The programmable interconnect device in accordance with claim 8 wherein said switch means further comprises:

a plurality of word lines, each word line being connected to a separate first subset of said memory cells for conveying a write signal thereto; and a plurality of bit lines, each bit line being connected to a separate second subset of said memory cells for conveying a bit thereto, such that each memory cell is connected to a unique combination of word and bit lines, and wherein each memory cell stores the bit conveyed by the bit line to which it is connected upon receipt of the write signal conveyed on the word line to which it is connected.

10. The programmable interconnect device in accordance with claim 9 wherein said programming means stores the received set of data bits in said switch means by successively placing separate subsets of said received set of data bits on said bit lines and transmitting a write signal on successive ones of said word lines.

11. The programmable interconnect device in accordance with claim 9 wherein said programming means sets said particular bit stored in said switch means to the indicated state by placing a bit of said indicated state on only a particular one of said bit lines and by transmitting a write signal on only a particular one of said word lines, and wherein said parallel data word identifies said particular bit by identifying said particular one of said bit lines and said particular one of said word lines.

12. The programmable interconnect device in accordance with claim 11 wherein said programming means stores the received set of data bits in said switch means by successively placing separate subsets of said received set of data bits on said bit lines and transmitting a write signal on successive ones of said word lines.

13. A programmable interconnect device for routing signals between signal ports in response to data from an external controller, the device comprising:

switch means having a plurality of signal ports, a plurality of groups of pass devices, each pass device interconnecting a separate pair of said signal ports and providing a signal path therebetween when said pass device is enabled, a plurality of control memory cells, each control memory cell being associated with a separate one of said groups of pass devices, each control memory cell storing a separate control bit having a state indicating whether said group of pass devices may be enabled, a plurality of switch memory cells, each switch memory cell being associated with a separate one of said pass devices and each switch memory cell storing a separate switch data bit indicating whether the associated pass device may be enabled, and logic means for selectively enabling each said pass device only when both the state of the control bit stored in the control memory cell associated with the subgroup of said pass device indicates the subgroup may be enabled and the state of the switch data bit stored in the switch memory cell associated with said pass device indicates the pass device may be enabled; and programming means for receiving a multiple bit parallel data word from said external controller, said parallel data word identifying a particular one data bit of said switch and control data bits stored in said switch and control memory cells and indicating a state to which said particular one data bit is to be set, and for setting said one particular one data bit to the indicated state without altering a state of any switch data bit stored in any other one of said switch and control memory cells.

14. The programmable interconnect device in accordance with claim 13 further comprising:

a plurality of input/output (I/O) ports, and bi-directional buffer means connected for buffering bi-directional signals between said I/O ports and said signal ports.

15. The programmable interconnect device in accordance with claim 13 further comprising:

a plurality of word lines, each word line being connected to a separate subset of said memory cells for conveying a write signal thereto; and a plurality of bit lines, each bit line being connected to a separate subset of said switch and control memory cells for conveying a bit thereto, wherein each switch and control memory cell is connected to a separate and unique combination of word and bit lines, and wherein each switch and control memory cell stores the bit conveyed by the bit line to which it is connected upon receipt of the write signal conveyed on the word line to which it is connected.

16. The programmable interconnect device in accordance with claim 15 wherein said programming means sets said particular bit stored in said switch means to the indicated state by placing a bit of said indicated state on only a particular one of said bit lines and by transmitting a write signal on only a particular one of said word lines, and wherein said parallel data word identifies said particular bit by identifying said particular one of said bit lines and said particular one of said word lines.

17. A programmable interconnect device for routing signals between signal ports in response to data from an external controller, the device comprising:

switch means having a plurality of signal ports, a plurality of groups of pass devices, each pass device interconnecting a separate pair of said signal ports and providing a signal path therebetween when said pass device is enabled, a plurality of control memory cells, each control memory cell being associated with a separate one of said groups of pass devices, each control memory cell storing a separate control bit having a state indicating whether said group of pass devices may be enabled, a plurality of switch memory cells, each switch memory cell being associated with a separate one of said pass devices and each switch memory cell storing a separate switch data bit indicating whether the associated pass device may be enabled, and logic means for selectively enabling each said pass device only when both the state of the control bit stored in the control memory cell associated with the subgroup of said pass device indicates the subgroup may be enabled and the state of the switch data bit stored in the switch memory cell associated with said pass device indicates the pass device may be enabled; and programming means for receiving switch and control data bits in serial form from said external controller and storing the received switch and control data bits in said control and switch means cells, for receiving a multiple bit parallel data word from said external controller, said parallel data word identifying a particular one data bit of said switch and control data bits stored in said switch and control memory cells and indicating a state to which said particular one data bit is to be set, and for setting said particular one data bit to the indicated state.

18. The programmable interconnect device in accordance with claim 17 further comprising:

a plurality of input/output (I/O) ports, and bi-directional buffer means connected for bi-directionally buffering signals between said I/O ports and said signal ports.

19. The programmable interconnect device in accordance with claim 17 wherein said interconnect device further comprises:

a plurality of word lines, each word line being connected to a separate subset of said memory cells for conveying a write signal thereto; and a plurality of bit lines, each bit line being connected to a separate subset of said switch and control memory cells for conveying a bit thereto, wherein each switch and control memory cell is connected to a separate and unique combination of word and bit lines, and wherein each switch and control memory cell stores the bit conveyed by the bit line to which it is connected upon receipt of the write signal conveyed on the word line to which it is connected.

20. The programmable interconnect device in accordance with claim 19 wherein said programming means stores the received set of switch and control data bits in said switch and control memory cells means by successively placing separate subsets of said received set of data bits on said bit lines and transmitting a write signal on successive ones of said word lines.

21. The programmable interconnect device in accordance with claim 19 wherein said programming means sets said particular bit stored in said switch means to the indicated state by placing a bit of said indicated state on only a particular one of said bit lines and by transmitting a write signal on only a particular one of said word lines, and wherein said parallel data word identifies said particular bit by identifying said particular one of said bit lines and said particular one of said word lines.

22. The programmable interconnect device in accordance with claim 21 wherein said programming means stores the received set of switch and control data bits in said switch and control memory cells means by successively placing separate subsets of said received set of data bits on said bit lines and transmitting a write signal on successive ones of said word lines.

23. A programmable interconnect device for routing signals between signal ports in response to data from an external controller, the device comprising:

switch means having a plurality of said signal ports, having a plurality of groups of cells, each for storing a separate data bit, each data bit having a state indicating whether said switch means is to convey a signal between a separate pair of signal ports associated with said data bit, and having means for conveying signals between each pair of signal ports when indicated by the state of the associated data bit; and programming means for receiving said set of data bits in serial form from said external controller and storing the received set of data bits in said memory cells, for receiving a multiple bit parallel data word from said external controller, said parallel data word identifying a particular one of said memory cells, conveying a bit to be stored in said particular memory cell, and indicating an action to be taken with respect to all other memory cells included in a group containing the particular memory cell, wherein upon receipt of said parallel data word, said programming means stores said bit in said particular memory cell and carries out said action, wherein said action comprises storing a bit of an indicated state in all of said other memory cells of said group.

* * * * *